United States Patent
Kang et al.

(10) Patent No.: US 6,841,003 B2
(45) Date of Patent: Jan. 11, 2005

(54) METHOD FOR FORMING CARBON NANOTUBES WITH INTERMEDIATE PURIFICATION STEPS

(75) Inventors: Sung Gu Kang, San Jose, CA (US); Craig Bae, San Jose, CA (US)

(73) Assignee: cDream Display Corporation, San Jose, CA (US)

( * ) Notice: Subject to any disclaimer, the term of this patent is extended or adjusted under 35 U.S.C. 154(b) by 105 days.

(21) Appl. No.: 10/302,206

(22) Filed: Nov. 22, 2002

(65) Prior Publication Data

US 2004/0099208 A1 May 27, 2004

(51) Int. Cl.[7] .............................................. C30B 25/14
(52) U.S. Cl. ........................ 117/92; 117/93; 117/102; 117/103; 117/108; 117/921; 117/929
(58) Field of Search ................. 117/929, 921, 117/92, 93, 102, 103, 108

(56) References Cited

U.S. PATENT DOCUMENTS

| | | | | |
|---|---|---|---|---|
| 6,331,209 | B1 * | 12/2001 | Jang et al. | 117/90 |
| 6,630,772 | B1 * | 10/2003 | Bower et al. | 313/311 |
| 2002/0021082 | A1 * | 2/2002 | Uemura et al. | 313/495 |
| 2002/0160111 | A1 * | 10/2002 | Sun et al. | 427/248.1 |
| 2004/0037972 | A1 * | 2/2004 | Simon et al. | 427/575 |

FOREIGN PATENT DOCUMENTS

EP  146613  * 10/2000

* cited by examiner

Primary Examiner—Robert Kunemund
(74) Attorney, Agent, or Firm—Fenwick & West LLP

(57) ABSTRACT

Carbon nanotubes are formed on a surface of a substrate using a plasma chemical deposition process. After the nanotubes have been grown, a purification step is performed on the newly formed nanotube structures. The purification removes graphite and other carbon particles from the walls of the grown nanotubes and controls the thickness of the nanotube layer. The purification is performed with the plasma at the same substrate temperature. For the purification, the hydrogen containing gas added as an additive to the source gas for the plasma chemical deposition is used as the plasma source gas. Because the source gas for the purification plasma is added as an additive to the source gas for the chemical plasma deposition, the grown carbon nanotubes are purified by reacting with the continuous plasma which is sustained in the plasma process chamber. This eliminates the need to purge and evacuate the plasma process chamber as well as to stabilize the pressure with the purification plasma source gas. Accordingly, the growth and the purification may be performed without shutting off the plasma in the plasma process chamber.

23 Claims, 4 Drawing Sheets

METHOD FOR FORMING CARBON NANOTUBES WITH INTERMEDIATE PURIFICATION STEPS

CROSS REFERENCE TO RELATED APPLICATIONS

This application is related to U.S. application Ser. No. 10/226,873, filed Aug. 22, 2002, and U.S. application Ser. No. 10/302,126, filed Nov. 22, 2002, both of which are incorporated by reference in their entirety.

FIELD OF THE INVENTION

The present invention generally relates to method for forming carbon nanotubes, and more specifically to forming purified carbon nanotubes from which graphitic and carbon particles are removed using a purification process.

DESCRIPTION OF THE RELATED ART

The carbon has four crystalline states which include diamond, graphite, fullerene and carbon nanotubes. The carbon nanotubes exhibit a number of remarkable electrical and mechanical properties, which make them very desirable for use in modern electronic devices, such as cathode-ray tubes (CRT).

The carbon nanotubes were originally created by means of an electric arc discharge between two graphite rods. However, this technique for forming nanotubes is not efficient and requires a complicated post-treatment or purification procedure.

The carbon nanotubes can be also grown on a substrate using a plasma chemical vapor deposition, as described, for example, in U.S. Pat. No. 6,331,209B1, the entire disclosure of which is incorporated herein by reference. Specifically, according to the disclosed method, which will be referred to herein as a conventional method for obtaining nanotubes, carbon nanotubes are grown on a substrate using a plasma chemical vapor deposition method at a high plasma density. The conventional carbon nanotube formation technique includes: growing a carbon nanotube layer on a substrate to have a predetermined thickness by plasma deposition; purifying the carbon nanotube layer by plasma etching; and repeating the growth and the purification of the carbon nanotube layer. For the purifying, a halogen-containing gas, for example, a carbon tetrafluoride gas, fluorine or oxygen containing gas is used as a source gas.

It should be noted that according to the conventional method for growing carbon nanotubes, after each nanotube growth step and before the nanotube purification step, the plasma in the process chamber has to be turned off and the process chamber has to be purged and evacuated. Subsequently, the pressure of the purifying gas needs to be stabilized and the plasma needs to be turned back on. The aforementioned multiple steps which need to be completed after the nanotubes have been grown and before they are purified make the conventional process for forming carbon nanotubes unduly expensive and time consuming.

Accordingly, what is needed is a technique for forming carbon nanotubes utilizing a fewer number of process steps.

SUMMARY OF THE INVENTION

The present invention is directed to methods and systems that substantially obviate one or more of the above and other problems associated with the conventional technique for forming carbon nanotubes. Consistent with exemplary embodiments of the present invention, there are provided methods for forming carbon nanotubes.

According to the inventive concept, a plurality of carbon nanotubes are formed on a substrate. The nanotubes are first grown on the substrate by plasma chemical deposition; and then purified by purification of the grown carbon nanotubes by plasma etching. The growth and the purification process are performed without shutting off the plasma. The substrate may be composed of a glass, a ceramic, a wafer, a crystal, or a metal alloy. Another embodiment of the present invention provides a process of forming carbon nanotubes in which carbon nanotubes are purified by removing graphite using plasma so that the carbon nanotubes can be easily grown with substantial density.

Further improvements include coating of the substrate surface with a catalytic material. In addition, a buffer layer may be provided between the substrate and the catalytic layer. During the growing, a hydrocarbon gas may be used as a source gas for the plasma chemical deposition and hydrogen-containing carbon gas may be used as an additive gas for enhancing the purification process. On the other hand, during the purification process, a hydrogen-containing gas which is the same to the additive gas which is used during the growing of the carbon nanotubes can be used as a source gas for the plasma continuously as a source gas for the plasma etching process. The purification process plasma source gas may be added as an additive to the source gas for the plasma chemical deposition.

A density of plasma which is utilized to perform the plasma chemical deposition and purification may be in the range of $10^{10}$ to $10^{12}/cm^3$. In one embodiment of the present invention, a plasma source which is utilized to perform the plasma chemical deposition may be a microwave plasma source, an inductively coupled plasma source or a capacitively coupled source.

Additional aspects related to the invention will be set forth in part in the description which follows, and in part will be obvious from the description, or may be learned by practice of the invention. Aspects of the invention may be realized and attained by means of the elements and combinations particularly pointed out in the appended claims.

It is to be understood that both the foregoing and the following descriptions are exemplary and explanatory only and are not intended to limit the claimed invention in any manner whatsoever.

BRIEF DESCRIPTION OF THE DRAWINGS

The accompanying drawings, which are incorporated in and constitute a part of this specification exemplify the embodiments of the present invention and, together with the description, serve to explain and illustrate principles of the inventive technique. Specifically.

DETAILED DESCRIPTION

In the following detailed description, reference will be made to the accompanying drawings, in which identical functional elements are designated with like numerals. The aforementioned accompanying drawings show by way of illustration, and not by way of limitation, specific implementations consistent with principles of the present invention. These implementations are described in sufficient detail to enable those skilled in the art to practice the invention and it is to be understood that other implementations may be utilized and that structural changes may be made without departing from the scope and spirit of present invention. The following detailed description is, therefore, not to be construed in a limited sense.

According to the inventive concept, carbon nanotubes are formed on a surface of a substrate using a plasma chemical deposition process. The material of the substrate can be chosen to provide for desired mechanical and electrical properties, such as conductivity and rigidity. In one embodiment of the invention, the substrate can be made of an electrically insulating material, such as a glass, quartz or ceramic plate. In an alternative embodiment of the substrate can be made of a metal alloy. Persons of skill in the art would undoubtedly appreciate that the choice of the substrate material is not essential to the concept of the present invention.

Figure 1:
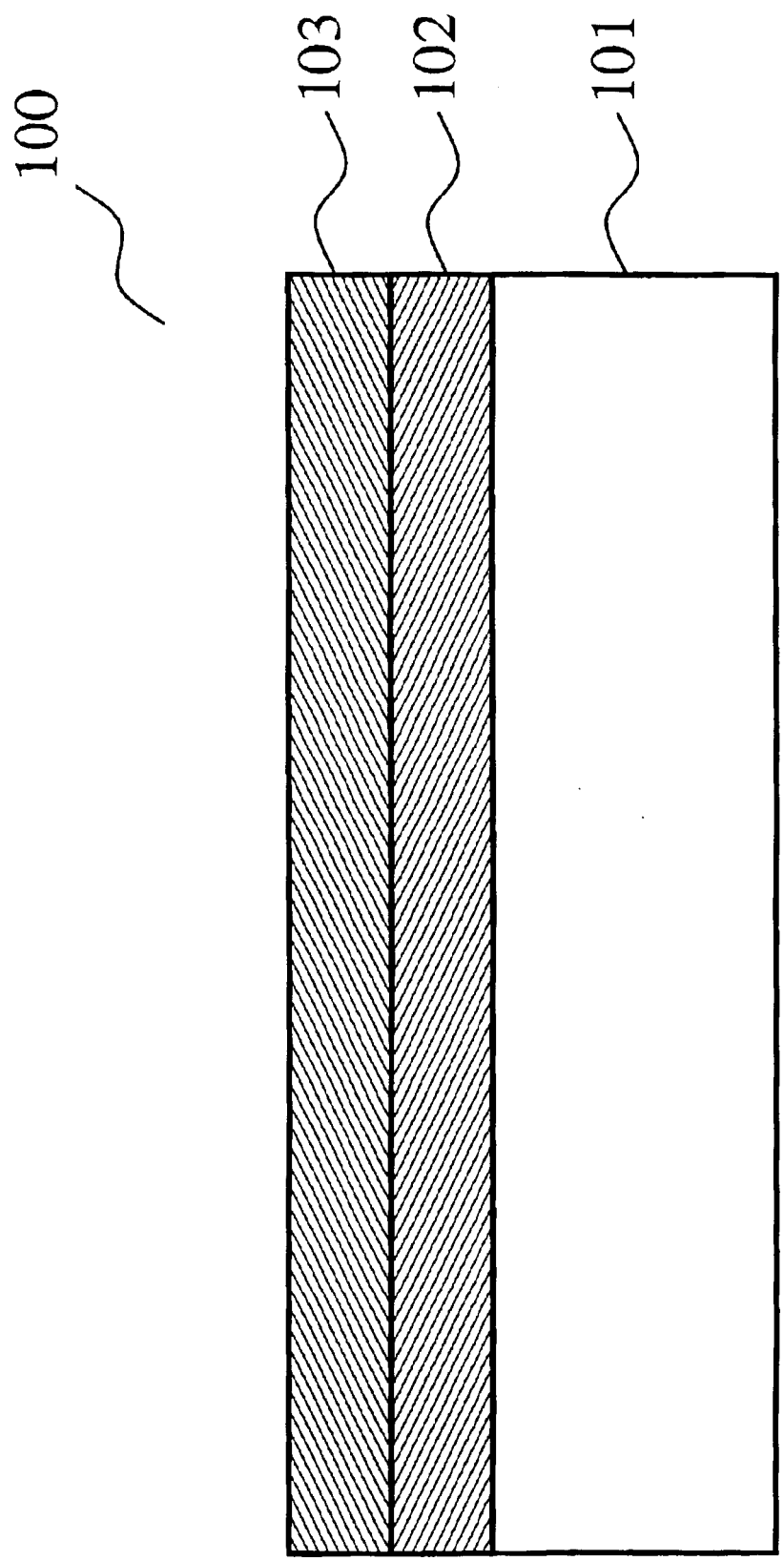
FIG. 1 illustrates a cross-sectional view of an exemplary embodiment of a substrate for use in the formation of carbon nanotubes according to the inventive concept.

Reference will now be made to FIG. 1, which illustrates a cross-sectional view of an exemplary embodiment 100 of a substrate for use in the formation of carbon nanotubes according to the inventive concept. To facilitate the formation of the carbon nanotubes thereon, the upper surface of the substrate 101 can be coated with a catalytic metal layer 103 of a predetermined thickness, as shown in FIG. 1. For example, this catalytic layer 103 may comprise one of the transition group metals, including, without limitation, nickel, cobalt and iron. Alternatively, the catalytic material 103 can comprise an alloy of one or more such metals. Various methods for coating substrate with catalytic layers of predetermined thickness are well known to persons of skill in the art. One such widely used method is a sputtering deposition process. The thickness of the catalytic layer 103 may vary in the range between 1 nm and 100 nm.

In an alternative embodiment of the invention an additional buffer 102 layer may be disposed between the substrate and the catalytic layer 103. The buffer layer 102 prevents the diffusion between the catalytic layer 103 and the substrate 101. In one embodiment of the invention, the buffer layer 102 may be formed of a metal. In one embodiment, the buffer layer 102 metal may be molybdenum. In an alternative embodiment, the buffer layer 102 may be of a titanium or titanium tungsten or titanium nitride. In yet another embodiment, the aforementioned layer material may comprise an alloy of titanium or titanium tungsten, titanium nitride. The substrate having the aforementioned catalytic and optional buffer layers 103 and 102, respectively, is placed into a plasma process chamber, where the nanotube layer growth is performed.

Figure 2:
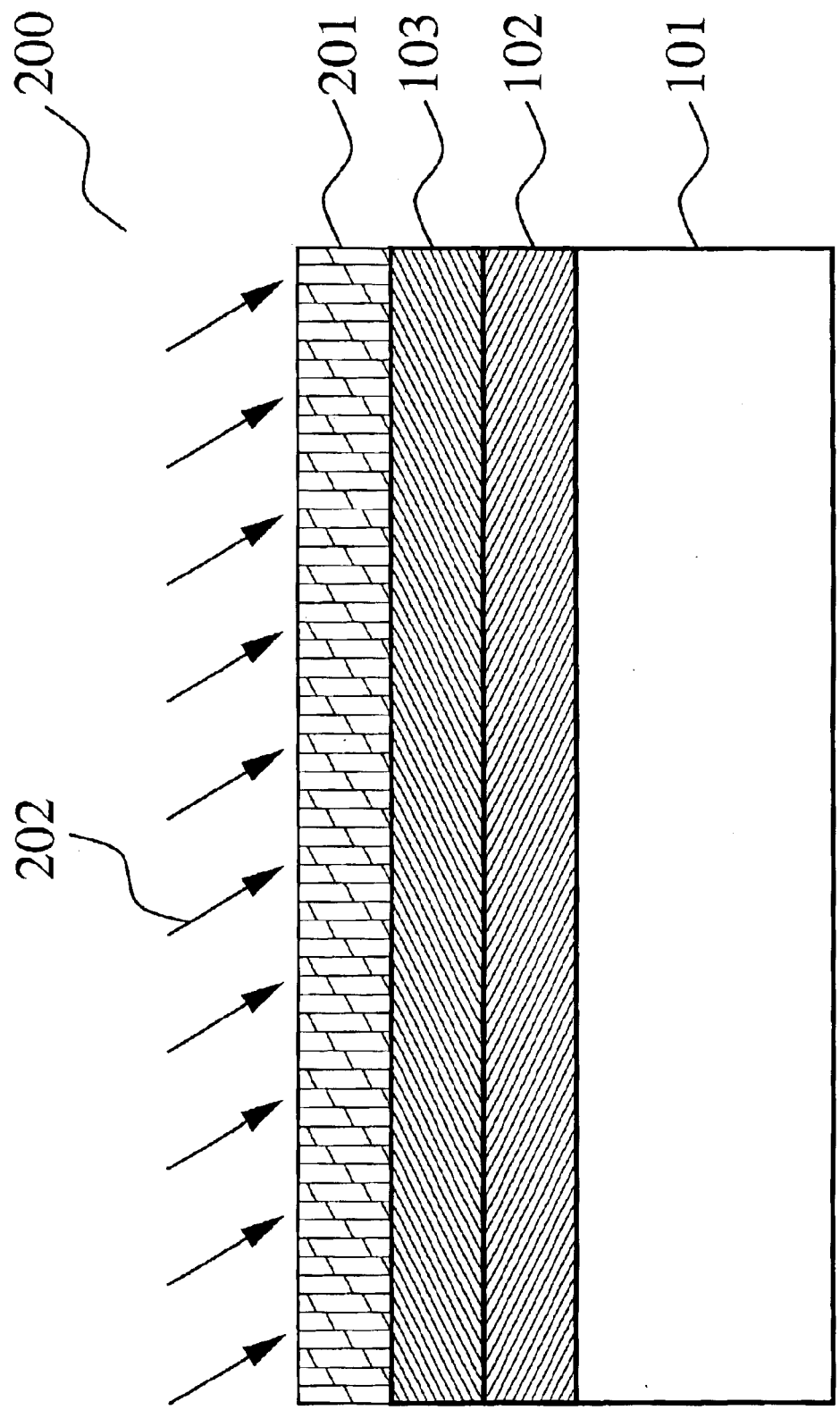
FIG. 2 illustrates a cross-sectional view of an exemplary embodiment of a substrate during the growth stage of the inventive carbon nanotubes formation process.

FIG. 2 illustrates a cross-sectional view of an exemplary embodiment 200 of a substrate during the growth stage of the inventive carbon nanotubes formation process. In that figure, numeral 202 designates deposition plasma produced by a plasma source, while numeral 201 designates the newly grown nanotube layer. To facilitate the growth process, the substrate 100 and the ambient gas in the plasma process chamber may be heated to a temperature in the range between 400° C. and 600° C. In one embodiment of the present invention, the plasma density to grow the carbon nanotubes is in the range of $10^{10}$ to $10^{12}/cm^3$. In one embodiment of the invention, an inductively coupled plasma or microwave plasma chamber capable of generating a high-density plasma is used in the nanotube growing process. The source gas for the plasma deposition 202 may be a hydrocarbon containing gas, having a hydrogen-containing gas as additive. The presence of the additive gas in the plasma process chamber facilitates the purification of the grown nanotube structures during the purification process without the purging of the process chamber. In another embodiment of the present invention, the plasma source may be an capacitively coupled plasma device.

In one embodiment of the present invention, the plasma source gas for growing the carbon nanotubes may be one of $CH_4$ and $C_2H_2$ gases. The temperature range of the substrate during the growing of the carbon nanotubes ranges between 400C to 600C and the plasma gas pressure ranges between 500 to 5000 mTorr. Carbon nanotube layer is grown in the plasma process chamber to a predetermined thickness. It should be noted that the aforementioned nanotube layer thickness is not linear with the time of growth.

Figure 3:
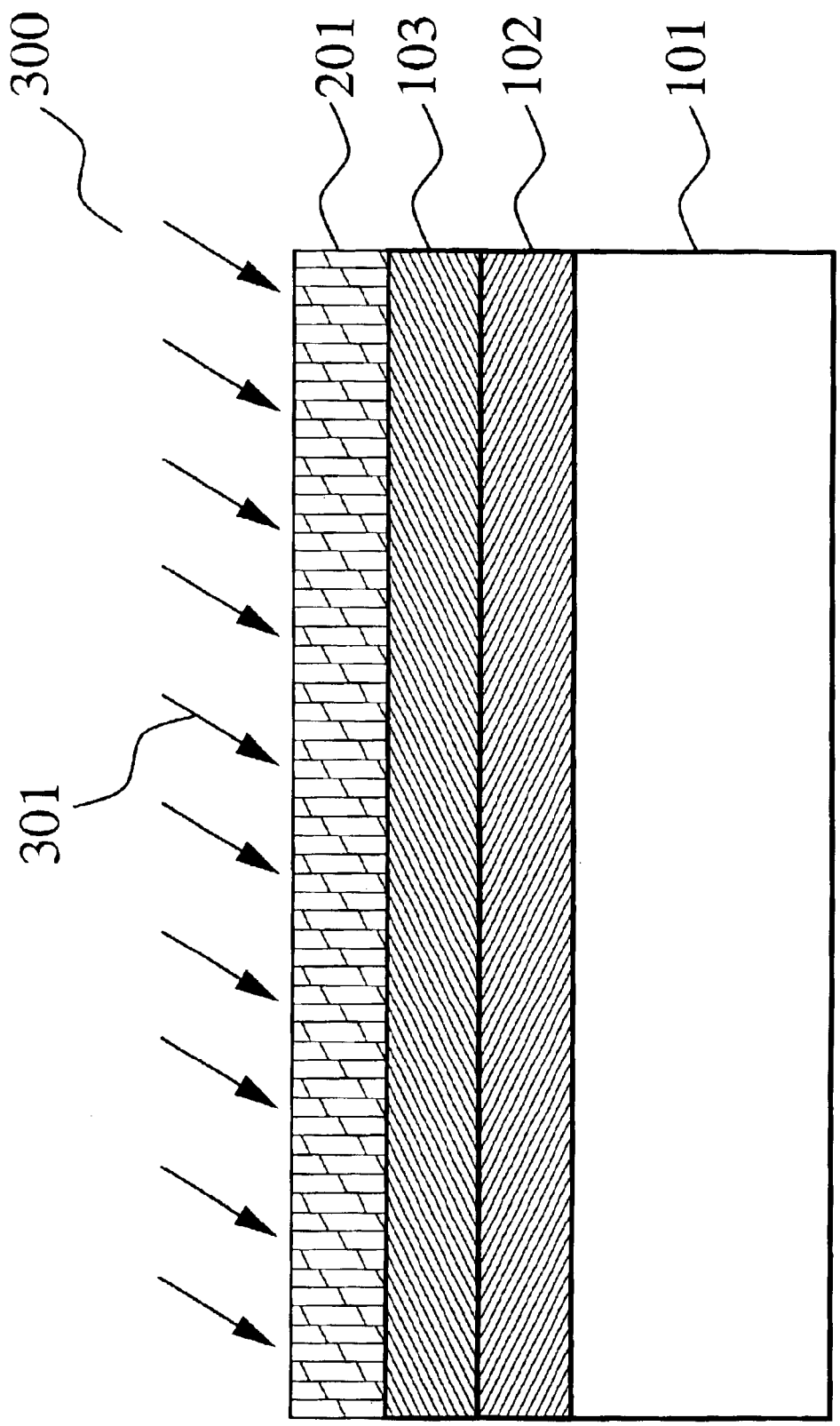
FIG. 3 illustrates a cross-sectional view of an exemplary embodiment of a substrate during the purification stage of the inventive carbon nanotubes formation process.

After the nanotubes have been grown in the described manner, the purification step is performed on the newly formed nanotube structures. Specifically, the purification process removes graphite and other carbon particles from the walls of the grown carbon nanotubes and controls the physical dimension or physical characteristics of the carbon nanotubes. FIG. 3 illustrates a cross-sectional view of an exemplary embodiment 300 of a substrate during the purification stage of the inventive carbon nanotubes formation process. In that figure, numeral 301 designates purification plasma produced by a plasma source. In one embodiment of the invention, the purification is performed with the plasma 301 at the same substrate temperature. For the purification process, the additive hydrogen containing gas is used as plasma source gas.

Figure 4:
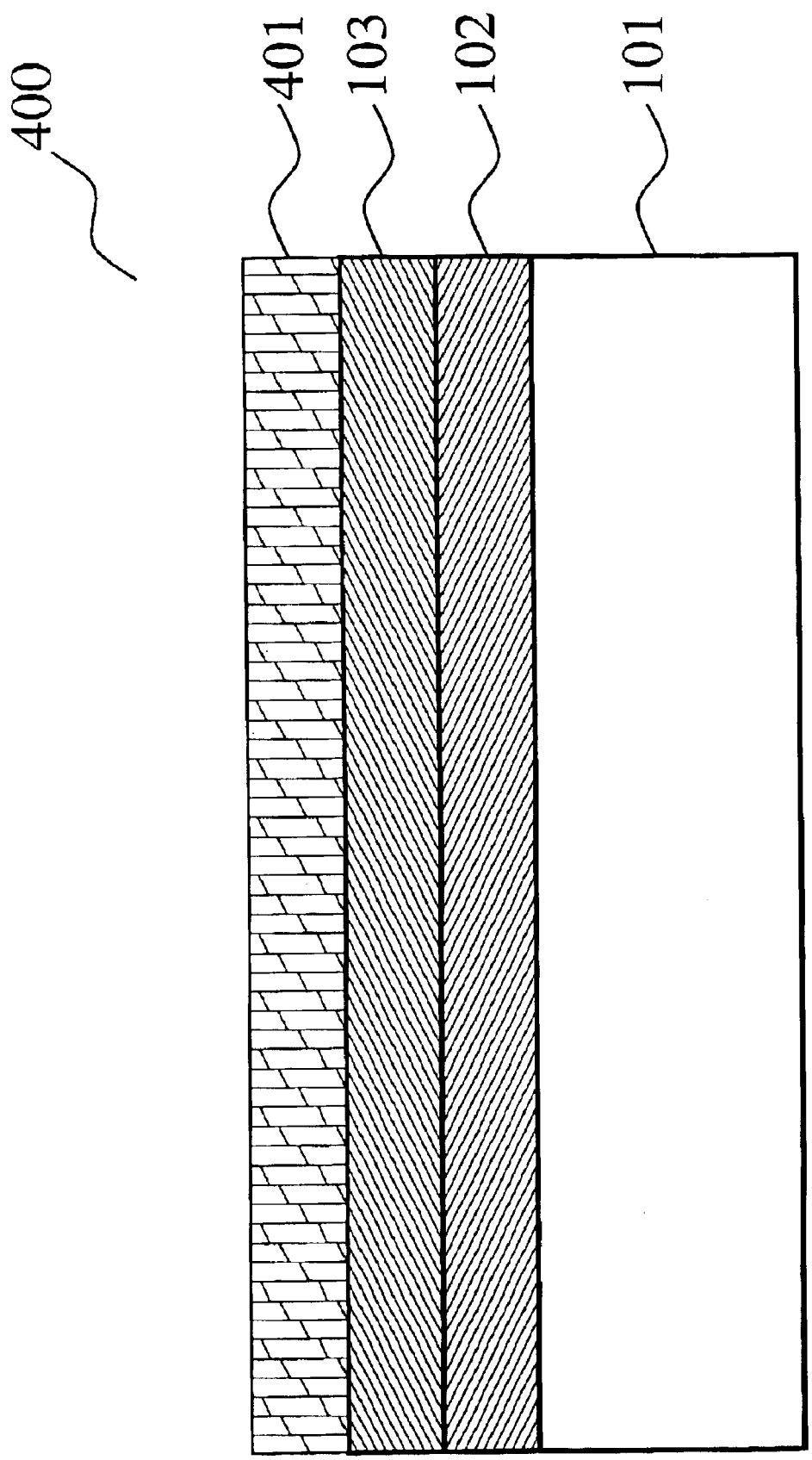
FIG. 4 illustrates a cross-sectional view of an exemplary embodiment of a substrate with carbon nanotube layer formed in accordance with the inventive process.

In one embodiment the additive hydrogen containing gas may be $H_2$, $NH_3$ or a mixture of $H_2$ and $NH_3$. Because the source gas for the purification plasma is added as an additive to the source gas for the chemical plasma deposition, the grown carbon nanotubes are purified by reacting with the continuous plasma which is sustained in the plasma process chamber. This eliminates the need to purge and evacuate the plasma process chamber as well as to stabilize the pressure with the purification gas. After the purification process, with the purification plasma, the nanotube growth and purification steps may be repeated. FIG. 4 illustrates a cross-sectional view of an exemplary embodiment 400 of a substrate with carbon nanotube layer 201 grown and purified in accordance with the inventive process.

It should be also noted that to facilitate the growth of nanotubes the catalyst layer may be optionally treated and granularized into nano size particles. This step is performed before the nanotubes are grown. In the granulation phase, the substrate is exposed to a plasma gas which causes patterning of the catalyst layer into nano particles. In this phase, the catalyst layer is granularised into multiple round shapes and randomly spread over the buffer layer. Having round shaped nano particles enhances the density of carbon nanotube formed on each catalyst particle.

In one embodiment of the present invention, the granule size of the catalyst particles may range from 1 nm to 200 nm. In one embodiment, the granule density may be in the range of $10^8/cm^2$ to $10^{11}/cm^2$. In one embodiment of the present invention, during granulation phase, the reaction surface of the catalyst layer is increased to a three dimensional surface through the round shape catalyst particles. The three dimensional surface of the catalyst particles enhances the growing of the carbon nanotubes. The three dimensional surface of the catalyst particles also helps in the diffusion of the carbon radical or the plasma to the catalyst layer. This helps reduce the temperature at which the carbon nano-tubes may be formed. The substrate is then placed in the chamber and heated to a temperature of about 400C to 600C.

In one embodiment of the present invention a negative voltage bias is applied to the substrate to improve the vertical growth of the carbon nanotubes. In one embodiment of the present invention a negative voltage bias is applied to the substrate during the vertical growth of the carbon nanotubes. After the carbon nanotubes are grown, the granular particles of the catalyst layer may be on the bottom and top of the carbon nanotubes.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein.

The present invention has been described in relation to particular examples, which are intended in all respects to be illustrative rather than restrictive. Those skilled in the art will appreciate that many different combinations of hardware, software, and firmware will be suitable for practicing the present invention.

Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming a plurality of carbon nanotubes on a substrate assembly comprising:

growing said plurality of carbon nanotubes by chemical deposition using a plasma;

purifying said plurality of grown carbon nanotubes by etching using said plasma; and repeating said growing and said purifying without shutting said plasma off.

2. The method of claim 1, wherein during said growing, a hydrocarbon gas is used as a source gas for said plasma chemical deposition.

3. The method of claim 2, wherein said hydrocarbon gas is $CH_4$.

4. The method of claim 2, wherein said hydrocarbon gas is $C_2H_2$.

5. The method of claim 1, wherein during said growing, a temperature of said substrate assembly is between 400° C. and 600° C.

6. The method of claim 2, wherein during said growing, a pressure is between 500 mTorr and 5000 mTorr.

7. The method of claim 1, wherein during said purifying, a hydrogen-containing gas is used as a source gas for said plasma etching.

8. The method of claim 7, wherein said hydrogen-containing gas is $NH_3$.

9. The method of claim 7, wherein said hydrogen-containing gas is $H_2$.

10. The method of claim 7, wherein said hydrogen-containing gas is a mixture of $H_2$ and $NH_3$.

11. The method of claim 1, wherein a microwave plasma source is used to perform said plasma chemical deposition.

12. The method of claim 1, wherein an inductively coupled plasma source is used to perform said plasma chemical deposition.

13. The method of claim 1, wherein a capacitively coupled plasma source is used to perform said plasma chemical deposition.

14. The method of claim 1, wherein a source gas for said plasma etching is added as an additive to a source gas for said plasma chemical deposition.

15. The method of claim 1, wherein a plasma density in the range of $10^{10}$ to $10^{12}/cm^3$ is used.

16. A method for forming carbon nanotubes in a chamber, the method comprising:

introducing a source gas into the chamber;

growing a plurality of carbon nanotubes by plasma enhanced chemical vapor deposition using the source gas;

introducing a purification gas into the chamber;

purifying the grown carbon nanotubes by plasma etching using the purification gas; and repeating the growing and purifying steps without evacuating the chamber.

17. The method of claim 16, wherein the source gas comprises a hydrocarbon gas.

18. The method of claim 16, wherein the source gas comprises a hydrocarbon gas selected from a group consisting of: $CH_4$ and $C_2H_2$.

19. The method wherein the purification gas comprises a hydrogen-containing gas.

20. The method of claim 16, wherein the purification gas comprises a hydrogen-containing gas selected from a group consisting of: $NH_3$ and $H_2$.

21. The method of claim 16, wherein the purification gas is introduced into the chamber as an additive to the source gas.

22. A method for forming carbon nanotubes, comprising:

a step for growing carbon nanotubes in a chamber by chemical deposition using a plasma;

a step for purifying the grown carbon nanotubes by plasma etching without shutting off the plasma or evacuating the chamber; and repeating the step for growing and the step for purifying a plurality of times.

23. An electron emissive device comprising a plurality of carbon nanotubes formed on a substrate by the method of any one of the preceding claims.

* * * * *

UNITED STATES PATENT AND TRADEMARK OFFICE
CERTIFICATE OF CORRECTION

PATENT NO. : 6,841,003 B2
DATED : January 11, 2005
INVENTOR(S) : Sung Gu Kang et al.

It is certified that error appears in the above-identified patent and that said Letters Patent is hereby corrected as shown below:

Column 6,
Line 36, please add -- of claim 16 -- after "method".

Signed and Sealed this

Tenth Day of May, 2005

JON W. DUDAS
*Director of the United States Patent and Trademark Office*